(12) United States Patent
Hawkes

(10) Patent No.: US 9,077,299 B2
(45) Date of Patent: Jul. 7, 2015

(54) PRE-DISTORTION FOR FAST POWER TRANSIENT WAVEFORMS

(71) Applicant: Scintera Networks LLC, Wilmington, DE (US)

(72) Inventor: Kelly Davidson Hawkes, Los Altos, CA (US)

(73) Assignee: SCINTERA NETWORKS LLC, Wilmington, DE (US)

(*) Notice: Subject to any disclaimer, the term of this patent is extended or adjusted under 35 U.S.C. 154(b) by 93 days.

(21) Appl. No.: 13/954,497

(22) Filed: Jul. 30, 2013

(65) Prior Publication Data

US 2014/0009228 A1 Jan. 9, 2014

Related U.S. Application Data

(63) Continuation of application No. 13/197,691, filed on Aug. 3, 2011, now Pat. No. 8,519,789.

(51) Int. Cl.
*H03F 1/26* (2006.01)
*H03F 1/32* (2006.01)

(52) U.S. Cl.
CPC ............ *H03F 1/3247* (2013.01); *H03F 1/3294* (2013.01); *H03F 2200/192* (2013.01); *H03F 2200/195* (2013.01); *H03F 2200/204* (2013.01); *H03F 2200/207* (2013.01); *H03F 2200/228* (2013.01)

(58) Field of Classification Search
USPC .................. 330/149; 375/296, 297; 455/63.1, 455/114.3, 126
See application file for complete search history.

(56) References Cited

U.S. PATENT DOCUMENTS

| | | | |
|---|---|---|---|
| 5,699,383 A | 12/1997 | Ichiyoshi | |
| 6,236,837 B1* | 5/2001 | Midya | ........................... 330/149 |
| 7,142,615 B2 | 11/2006 | Hongo et al. | |
| 7,414,470 B2 | 8/2008 | Okazaki | |
| 7,646,238 B2 | 1/2010 | Okazaki | |
| 8,170,508 B2* | 5/2012 | Davies | ........................... 330/149 |
| 8,331,487 B2* | 12/2012 | Yu et al. | ...................... 455/114.3 |
| 2004/0248516 A1 | 12/2004 | Demir et al. | |
| 2005/0231279 A1* | 10/2005 | Moffatt et al. | ................. 330/149 |

* cited by examiner

*Primary Examiner* — Khanh V Nguyen

(57) ABSTRACT

An apparatus and a method select and use parameter values for an RF power amplifier linearizer to pre-distort the input signals of a power amplifier, so as to achieve a linear output response in the power amplifier. The apparatus and the method select from a number of sets of parameter values, each set of parameter values corresponding to a different output power range of the power amplifier. The set of parameters include a coefficient vector tailored for the particular output power range for that set. The power amplifier input power is repeatedly measured and filtered at various time intervals. The input power measurements may be filtered by a fast attack/slow decay filter, which follows the peaks of the measurements under operation of the fast attack portion of the filter and provides a low variance during operation of the slow decay portion of the filter.

20 Claims, 5 Drawing Sheets

| Bin | $RF_{IN}$ power at bin center, dBm | Power detector gain, dB | $RF_{FB}$ SPM gain, dB | Coefficient Set | $PA_{OUT}$ power, dBm |
|---|---|---|---|---|---|
| 0 | $R_0 = R + 1.50$ | $D_0 = D - 1.50$ | $S_0 = S - 1.50$ | $w_0$ | $WP + 1.50$ |
| 1 | $R_1 = R + 0.75$ | $D_1 = D - 0.75$ | $S_1 = S - 0.75$ | $w_1$ | $WP + 0.75$ |
| 2 | $R_2 = R + 0.00$ | $D_2 = D + 0.00$ | $S_2 = S + 0.00$ | $w_2$ | $WP + 0.00$ |
| 3 | $R_3 = R - 0.75$ | $D_3 = D + 0.75$ | $S_3 = S + 0.75$ | $w_3$ | $WP - 0.75$ |
| 4 | $R_4 = R - 1.50$ | $D_4 = D + 1.50$ | $S_4 = S + 1.50$ | $w_4$ | $WP - 1.50$ |
| 5 | $R_5 = R - 2.25$ | $D_5 = D + 2.25$ | $S_5 = S + 2.25$ | $w_5$ | $WP - 2.25$ |
| 6 | $R_6 = R - 3.00$ | $D_6 = D + 3.00$ | $S_6 = S + 3.00$ | $w_6$ | $WP - 3.00$ |

Figure 3

PRE-DISTORTION FOR FAST POWER TRANSIENT WAVEFORMS

RELATED APPLICATION

The present invention is a continuation of U.S. patent application Ser. No. 13/197,691 filed Aug. 3, 2011, which is incorporated herein by reference in its entirety as if fully set forth herein.

FIELD OF THE INVENTION

The present invention relates to signal processing. In particular, the present invention relates to providing pre-distortion of input signals to a power amplifier in order to linearize the output response of the power amplifier, especially in the presence of fast power transient waveforms.

DISCUSSION OF THE RELATED ART

One design goal of a typical RF power amplifier linearizer is to provide low adjacent channel leakage ratio (ACLR) over a wide range of output power of the associated power amplifier. In the prior art, such an RF power amplifier linearizer uses a single set of coefficients for all operating power levels for the power amplifier. The set of coefficients are, for example, the coefficients of corresponding basis functions in the output response of the power amplifier linearizer, in which the output response is expressed as a linear sum of basis functions. However, using a single set of coefficients achieves good performance (i.e., within 1 dB of the best ACLR) typically only across a 1.5 dB range of output powers. Thus, there is a need for improving ACLR performance over a wider range of output powers.

SUMMARY OF THE INVENTION

The present invention provides, in an RF power amplifier linearizer, an apparatus and a method that select and use a set of parameter values, from multiple set of parameter values, to pre-distort the input signals of the associated power amplifier, so as to achieve a linear output response in the power amplifier.

According one embodiment of the present invention, multiple sets of parameter values are maintained for an RF power amplifier linearizer, with each set of parameter values corresponding to a different output power range of the power amplifier. The parameters in each set of parameter values include a coefficient vector. The values in the coefficient vector for each set of parameter values are tailored for the particular output power range corresponding to that set. In that embodiment, the power amplifier input power is repeatedly measured and filtered at various time intervals. The input power measurements are filtered by a fast attack/slow decay filter, which tracks the peaks of the measurements under operation of the fast attack portion of the filter and provides a low variance during operation of the slow decay portion of the filter. The values of the coefficient vector for predistortion linearization of the power amplifier is adapted dynamically, in response to changes in the input power level of the power amplifier. In one embodiment, hysteresis is used to reduce the rate at which the predistortion linearizer hops between two sets of the parameter values. The present invention achieves good ACLR performance across a wide range of power amplifier output power and is able to respond quickly to rapid increases in the input power level of the power amplifier. Such characteristics are particularly advantageous in a system in which waveforms having fast power transients are present. The present invention allows an RF power amplifier linearizer integrated circuit to be tailored to any power amplifier that may be used in a power amplifier system.

The present invention is better understood upon consideration of the detailed description below in conjunction with the accompanying drawings.

BRIEF DESCRIPTION OF THE DRAWINGS

FIG. 3 shows parameter values used by controller 24, in accordance with one embodiment of the present invention.

DETAILED DESCRIPTION OF THE PREFERRED EMBODIMENTS

Figure 1:
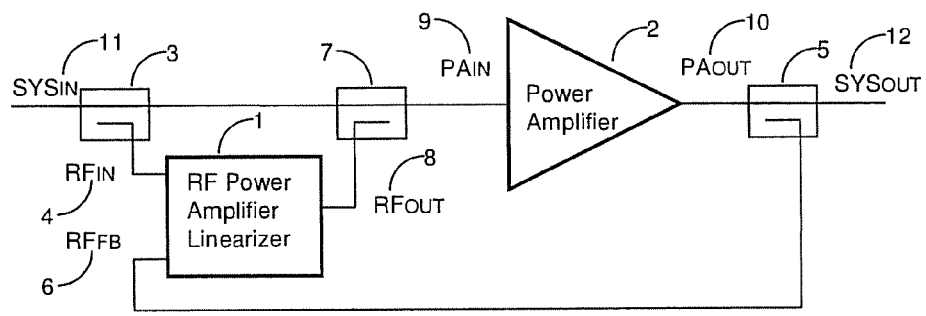
FIG. 1 shows system 100 which is suitable for implementing an apparatus or a method of the present invention.

FIG. 1 shows system 100 which is suitable for implementing an apparatus or a method of the present invention. System 100 includes signal couplers 3, 5 and 7, RF power amplifier linearizer 1 and power amplifier 2. When its input signal is at a high power, power amplifier 2 may go into compression (i.e., the output signal gain of power amplifier 2 at that high power is less than the output signal gain of power amplifier 2 at a lower power). As shown in FIG. 1, signal coupler 3 provides input waveform 11 as input signal 4 to RF power amplifier linearizer 1. In response to input signal 4, RF power amplifier linearizer 1 generates output signal 8 which is coupled by signal coupler 7 to input waveform 11 to provide input signal ($PA_{IN}$) 9 of power amplifier 2. When input waveform 11 has a power that falls within power amplifier 2's region of compression, output signal 8 of RF power amplifier linearizer 1 increases the power of input signal 9. In this manner, couplers 3 and 7 and the RF power amplifier linearizer 1 increase the power at the peaks of input signal 9, so as to compensate for power amplifier 2's compression. Signal coupler 5 couples output signal 10 to provide a feedback signal ($Rf_{FB}$) 6. Output waveform 12—a system output signal of system 100—is ideally simply a scaled version of the input waveform 11. In other words, output signal 12 is maintained at a substantially constant gain relative to input signal 11 (i.e., $SYS_{OUT}(t)=G\ SYS_{IN}(t)$, where G is the system voltage gain).

Figure 2:
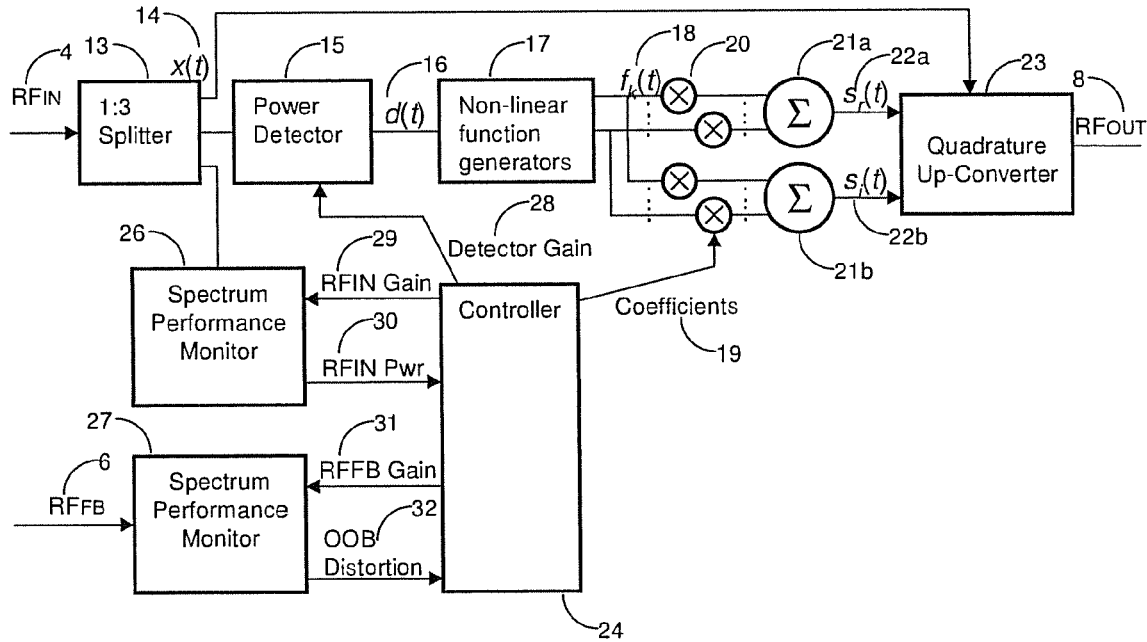
FIG. 2 is a block diagram showing the signal processing within the RF power amplifier linearizer 1, in accordance with one embodiment of the present invention.

FIG. 2 is a block diagram showing the signal processing within the RF power amplifier linearizer 1, in accordance with one embodiment of the present invention. As shown in FIG. 2, input waveform 4 is represented by its complex envelope (x(t)) 14, which is provided by power splitter 13 to power detector (PDET) 15, quadrature up-converter 23 and spectrum performance monitor 26. Power detector 15 provides baseband signal (d(t)) 16, which represents the power in complex envelope x(t) (i.e., $d(t)=G_D|x(t)|^2$ where $G_D$ is set by programmable detector gain signal 28 from controller 24). From baseband signal 16 (i.e., d(t)), non-linear function generators 17 generates monomials of d(t) at various amounts of delay. In one embodiment, the following monomials are generated:

$f_1(t)=d(t)$
$f_2(t)=d^2(t)$
$f_3(t)=d^3(t)$
$f_4(t)=d(t-\tau)$
$f_5(t)=d^2(t-\tau)$
$f_6(t)=d^3(t-\tau)$
$f_7(t)=d(t-3\tau)$
$f_8(t)=d^2(t-3\tau)$
$f_9(t)=d^3(t-3\tau)$
$f_{10}(t)=d(t-5\tau)$
$f_{11}(t)=d^2(t-5\tau)$
$f_{12}(t)=d^3(t-5\tau)$ where τ may be, for example, 1 ns.

The monomials are used as basis functions ($f_k(t)$) 18 to construct in-phase baseband correction signal ($s_i(t)$) 22b and quadrature baseband correction signal ($s_r(t)$) 22a. Basis functions 18 are each multiplied at multiplying digital-to-analog converters (DACs) 20 by a corresponding one of coefficients 19 and summed, at summers 21a and 21b, to provide in-phase baseband correction signal 22a and quadrature baseband correction signal 22b. Quadrature up-converter 23 mixes the baseband corrections signals 22a and 22b with complex envelope 14 to provide output signal ($RF_{OUT}$) 8. In one example, all of coefficients 19 are zero, except for the first one ($w_{1,1}$), which is given by $w_{1,1}=0.3$, so that in-phase baseband correction signal 22a is given by $s_r(t)=0.3\ G_D|x(t)|^2$ and quadrature baseband correction signal 22b is given by $s_r(t)=0$. Consequently, the complex envelope of the output signal 8 of quadrature up-converter 23 is given by: $RF_{OUT}(t)=0.3\ G_D|x(t)|^2x(t)$. In this example, in-phase baseband correction signal 22a is a third order distortion signal with an amplitude governed by the $w_{1,1}$ coefficient. If power amplifier 2 has a third order compression characteristic (e.g., $PA_{OUT}(t)=[1-0.3|PA_{IN}(t)|^2]PA_{IN}(t))$, and there are no carrier phase delays, then the $w_{1,1}$ coefficient compensates for the compression characteristic until system 100, as shown in FIG. 1, has an output distortion that is minimized. Output signal 12 thus approximates a linear system: $SYS_{OUT}(t) \approx G\ SYS_{IN}(t)$.

As shown in FIG. 1, any distortion that is introduced into power amplifier 2's output waveform 10 is sampled by coupler 5 in RF feedback signal 6. As shown in FIG. 2, spectrum analysis is performed in spectrum performance monitor 27 on RF feedback signal 6 to measure out-of-band (OOB) distortion power 32. In one embodiment, input waveform 4 contains two tones at RF frequencies $f_1$ and $f_2$ and power amplifier 2 has a strong third order distortion. As a result, intermodulation products appear at RF frequencies $2f_1-f_2$ and $2f_2-f_1$, so that $Rf_{FB}$ spectrum performance monitor 27 measures power at RF frequencies that include $2f_1-f_2$ and $2f_2-f_1$. Coefficients 19 are adapted by controller 24 to minimize out-of-band distortion power 32. When measuring out-of-band distortion power 32, controller 24 selects a gain in spectrum performance monitor 27, represented by $RF_{FB}$ Gain signal 31, that provides a low noise figure but does not clip the analog-to-digital converter within $RF_{FB}$ spectrum performance monitor 27.

Controller 24 sets to a constant (i.e., not time-varying) level a gain for $RF_{IN}$ spectrum performance monitor 26. This gain, which is represented in FIG. 2 by $RF_{IN}$ gain signal 29, enables $RF_{IN}$ spectrum performance monitor 26 to provide $RF_{IN}$ power signal 30 across the operating power range of input signal ($RF_{IN}$) 4. $RF_{IN}$ power signal 30 is preferably measured as frequently as possible to allows controller 24 to quickly react to changes in the signal level of input waveform ($RF_{IN}$) 4. The actual measurement frequency in each case depends, for example, on the capabilities of $RF_{IN}$ spectrum performance monitor 26 and controller 24. In practice, if the measurement interval is set too short, the measured $RF_{IN}$ power signal 30 will have too much variance. If the measurement interval is set too long, the delay between the time input signal ($RF_{IN}$) 4 actually changes in power and the time at which controller 24 actually changes detector gain signal 28 and coefficients 19 will be too long. During such a delay, detector gain signal 28 and coefficients 19 may not be at their optimum values and the resulting distortion in system output signal 12 may be too high. In one embodiment of the present invention, the measurement interval is set to 40 μs and a new measurement is computed every 110 μs.

Controller 24 may be implemented by a microprocessor that executes a firmware program. FIG. 3 shows parameter values used by controller 24, in accordance with one embodiment of the present invention. As shown in FIG. 3, the parameter values are organized into 7 sets ("bins") according to the power of input signal ($RF_{IN}$) 4. provided in column 42 Each bin, which is assigned a bin number (shown in column 41 of FIG. 3). is associated with a range of power levels $R_n$, $0 \le n < 7$, centered at a value defined relative to a working point R (see, column 42). For example, bin 0 (which has the lowest power) is centered at power level $R_0=R+1.50$, bin 2 is centered at power level $R_2=R$ (i.e., the working point), and bin 6 (which has the highest power) is centered at power level $R_0=R-3.00$. The number of bins and the location of the working point shown in FIG. 3 are merely exemplary. The actual number of bins provided and the placement of the working point are design parameters, and many other values for these parameters are possible. One may select as the working point of a power amplifier, for example, the ratio of the 3 dB peak compression power to the peak-to-average power ratio (PAR) of the input waveform. Typically, the peak power is defined as that power level threshold which is exceeded by the instantaneous power 0.01% of the time. Other definitions of peak power may also be devised and used. Associated with each bin also are, for example, the power detector gain (i.e., the value represented by detector gain signal 28) in column 43, $RF_{FB}$ spectrum power performance monitor gain (i.e., the value represented in $RF_{FB}$ gain signal 31) in column 44, and coefficient 19 in column 45. The linearized power amplifier output power is provided in column 46, where WP denotes the power at the working point.

Controller 24 repeatedly reads the value on $RF_{IN}$ power signal 30 from $RF_{IN}$ spectrum performance monitor 26 and applies the power readings to a "fast attack/slow decay" filter, described below. The output of the fast attack/slow decay filter is used to select the bin to use, based on matching the filter output with FIG. 3's power levels of column 42. Based on the selected bin number, the power detector gain is selected from column 43 and downloaded to power detector 15 through detector gain signal 28. In a similar fashion, coefficients 19 are selected from column 45 and downloaded to the multiplying DACs 20. To maximize the dynamic range of $RF_{FB}$ spectrum performance monitor 27, the $RF_{FB}$ gain for the selected bin in column 44 is downloaded via $RF_{FB}$ gain signal 31 to $RF_{FB}$ spectrum performance monitor 27. The power detector gains in column 43 and the $RF_{FB}$ gains in column 44 may be provided in units of dB, as shown in FIG. 3, but other convenient units are also possible. In a similar fashion, the power units in FIG. 3 are provided as dBm, but other units such as mW, dBFS (dB relative to full scale of an analog to digital converter), dBN (a scale based on $\log_2$: e.g., dBN=0.3322 dBFS+18), or s16 (a scale based on using 16 bit arithmetic: e.g., s16=340.1654 dBFS+18431) may also be used. Parameter values may be represented in any suitable way. For example, a tabular listing of the gains, a binary encoding of the gains in which each bit represents whether or not an attenuator is used or bypassed, or a control word for a variable gain amplifier may also be used.

Figure 4:
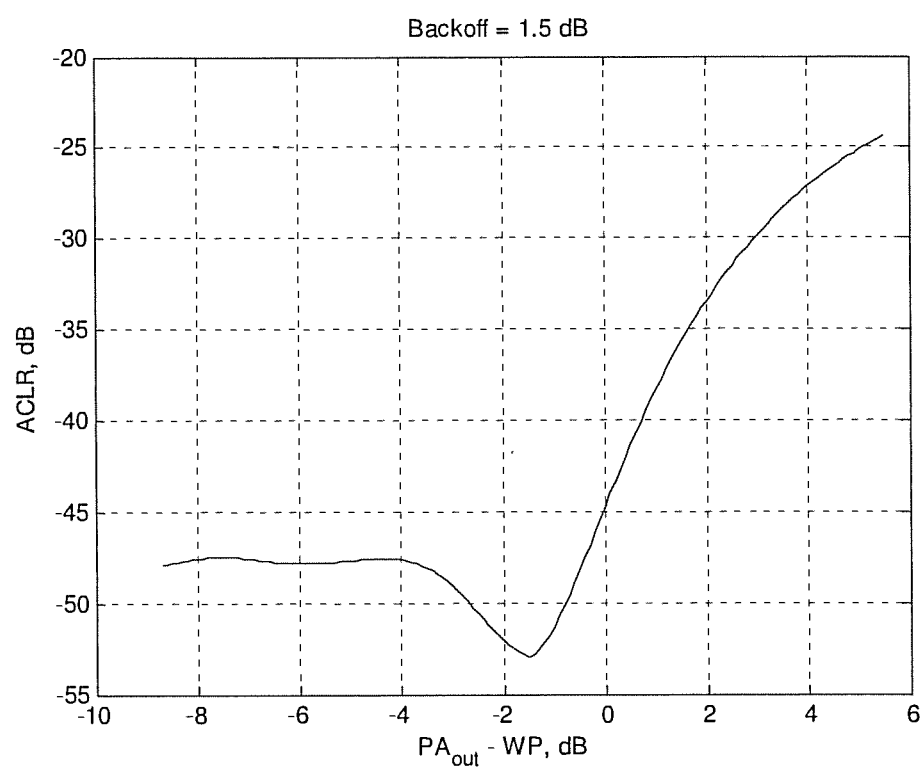
FIG. 4 plots adjacent channel leakage ratio (ACLR) as a function of relative output power for a particular power amplifier.

The motivation behind using multiple sets of parameter values, one set for each selected bin (or range of power levels), is illustrated by FIG. 4. FIG. 4 plots adjacent channel leakage ratio (ACLR) as a function of relative output power for a particular power amplifier. ACLR is a measure of out-of-band distortion[1]. As used in this detailed description, ACLR may be provided by: ACLR=D–S, where D is the distortion power and S is the signal power (both in dB). In FIG. 4, the x-axis is the difference in dB between the power amplifier output power and the working point of the power amplifier. In FIG. 4, the coefficient vector $w_4$ is trained at an output power of WP−1.5 dB (bin 4 of FIG. 3), The coefficient vector is then held constant and the ACLR is measured as the power amplifier output power was varied from WP−8.8 dB to WP+5.5 dB. As seen in FIG. 4, the best ACLR performance occurs at WP−1.5 dB, the power at which the coefficient vector is trained. The same training may be carried out at different output power levels. In one embodiment, the ACLR curves as a function of relative output power at different power levels form a family of curves similar to that corresponding to coefficient vector $w_4$ shown in FIG. 4, but offset horizontally by the different output power ranges. In each curve, the local minimum ACLR corresponds to the power amplifier output power associated with the center of the bin. This result suggests that, to have good ACLR performance, a system should have several different coefficient vectors to be applied at different output power ranges.

[1] For a definition of ACLR, please see paragraph 6.5.2.2.1 of ETSI TS 125 141, "Universal Mobile Telecommunications System (UMTS); Base Station (BS) conformance testing (FDD) (3GPP TS 25.141 version 9.2.0 Release 9)", February 2010.

Figure 5:
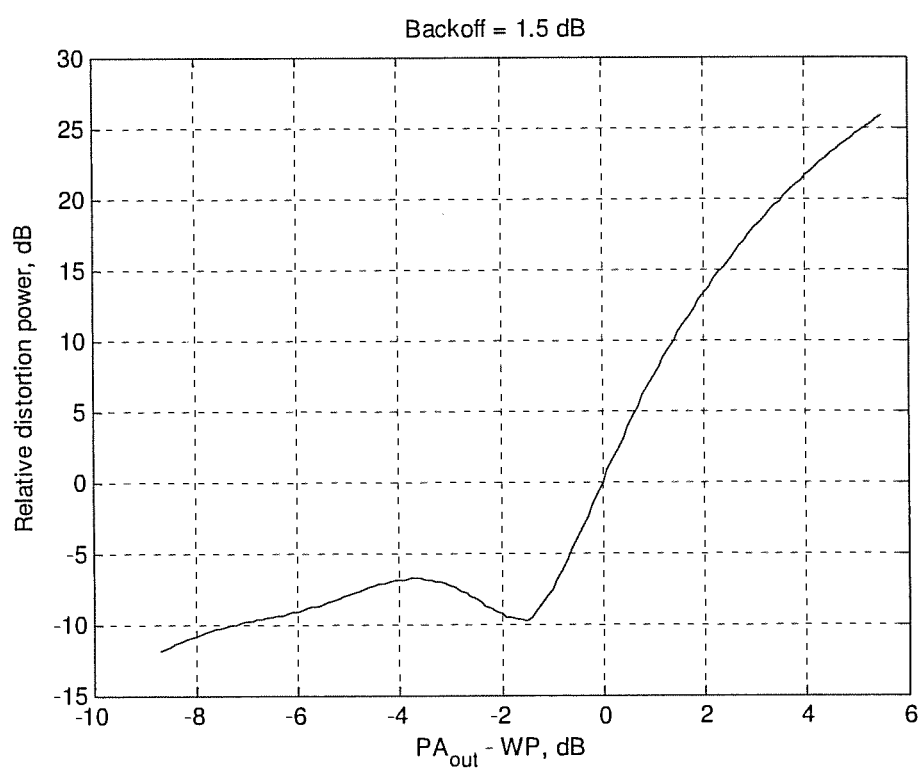
FIG. 5 plots relative distortion power as a function of relative output power for a particular power amplifier.

FIG. 5 plots relative distortion power as a function of relative output power for a particular power amplifier. The relative distortion power of FIG. 5 is given by D−$D_{WP}$, where $D_{WP}$ is the distortion power when the power amplifier is operating at its working point. In the embodiment illustrated in FIG. 5, the slope of the relative distortion power curve at the working point is 8:1, such that, near the working point, for every dB that the signal's power is increased, the distortion power increases 8 dB. Although each given power amplifier has a different distortion versus power curve, in this embodiment, the power amplifier was within 1 dB of the best relative distortion across a 1.5 dB range, from WP−2.6 dB to WP−1.1 dB. Consequently, to ensure that the relative distortion power suffer no more than 1 dB decrease in performance, the bin spacing should be less than 1.5 dB.

The bin spacing shown in FIG. 3 is 0.75 dB, although other bin spacings may also be used (e.g., non-uniform spacings). If the bin spacing is set too large, then the stitching together of the family of curves, one for each bin (e.g., the ACLR curve of FIG. 4), would have large scallops and the average ACLR would degrade. If the fast attack/slow decay filter output, described below, has a high standard deviation relative to the bin spacing, then the pre-distortion operation may switch between bins more frequently than is desirable, as momentary degradation in ACLR performance may result during bin switching. Consequently, any unnecessary switching should be avoided. In the embodiment shown in FIG. 3, seven bins with a 0.75 dB bin spacing span 4.5 dB, from the first bin center to the last bin center. If the bin spacing is increased, the dynamic range over which the power amplifier can be linearized is also increased. If the number of bins is increased, then the memory requirements to hold the various hardware parameter values, including coefficients 19, is also increased. As shown in FIG. 5, as the power amplifier output power decreases, the relative distortion power also decreases, such that, below some output power level (e.g., 1 dB below the working point), the relative distortion power may be sufficiently low that additional bins are not warranted. This characteristic limits the required number of bins, the required bin spacing or both.

EVDO, HSDPA, WiMax, LTE, and TD-SCDMA are wireless communication standards that are known to generate fast power transients (FPT) during operation. A FPT waveform hops between power levels, remaining at each level only for a short period of time. For example, in one multi-carrier waveform, EVDO traffic on one carrier exists simultaneously with CDMA traffic on a second carrier. When both carriers have active data traffic, performance degradations due to fast power transients are not significant. However, when the EVDO carrier is not transmitting data, signal pulses are generated for 182 μs to transmit the medium access control (MAC) and pilot overhead, but data traffic for the EVDO carrier is turned off for 651 μs, as there is no data in the payload. As a result, the power of the multi-carrier waveform hops between two power levels, one level corresponding to when activities are present in both the EVDO carrier and the CDMA carrier, and the other corresponding to when activities are present only in the CDMA carrier.

Figure 6:
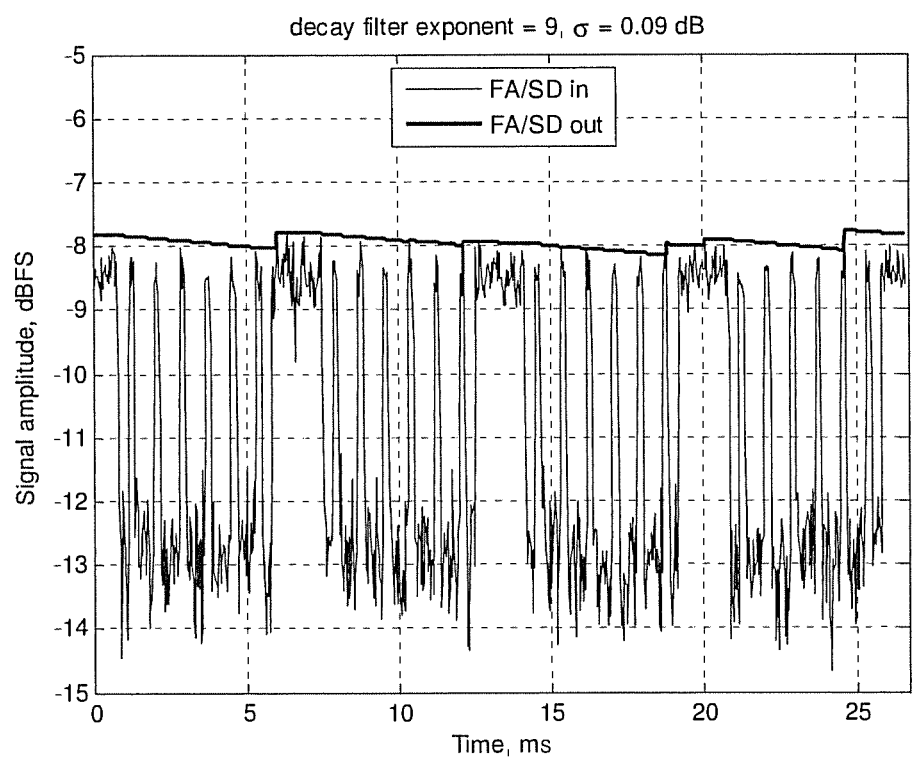
FIG. 6 illustrates the performance of the fast attack/slow decay filter on a two-carrier waveform, in accordance with one embodiment of the present invention.

An FPT waveform may result in significant performance degradation in a linearization system that has only one coefficient vector. As seen in FIG. 6, the FPT waveform may hop between two power levels: WP−1.5 dB and WP. In the example of FIG. 5, the relative distortion power is 10 dB greater when the power is at WP, as compared to when the relative distortion power is at WP−1.5 dBm. The average distortion, $D_{AVE}$, for this single coefficient set scenario, can be expressed as:

$$D_{AVE} = 10\log_{10}\left[\int_{-\infty}^{\infty} p(S) 10^{\frac{D(S)}{10}} dS\right]$$

where p(S), is a probability density function for the instantaneous signal power, S, and D(S) is the relative distortion power associated with that signal power (i.e., the curve of FIG. 5). Thus, to minimize the average distortion, the system should avoid operating where D(S) is large or when $10^{[D(S)/10]}$ is larger still. Better performance is achieved for the example of FIG. 5, by operating with the coefficient set $w_2$, which optimizes relative distortion power performance at a power level of WP rather than operating with the coefficient set $w_4$, which optimizes the relative distortion power at a power level of WP−1.5 dB. By using the coefficient set near WP, one avoids the steep portion of the curve near WP in the curve of FIG. 5. To first order, the relative distortion power versus relative output power curve for coefficient vector $w_4$ has the same form as the relative distortion power versus relative output power curve corresponding to the coefficient vector $w_2$, except that it is shifted to the right by 1.5 dB.

To operate in the presence of FPT waveforms, it is desirable to move rapidly into operation at the higher power level during the high power portions of the FPT waveform. At the same time, however, one should also avoid excessively switching back and forth between adjacent bins. A low pass filter on the $RF_{IN}$ power measurement signal 30 provides a low variance relative to the bin spacing, so that controller 24 infrequently switches between bins. Rapid acquisition during high power operation and low variance are desirable and may be achieved using a fast attack/slow decay filter. The fast attack/slow decay filter may be implemented, for example, in the firmware of controller 24. Other implementations of the fast attack/slow decay in hardware are also possible.

Let x(n) represent the sequence of the input signal derived from sampling $RF_{IN}$ power measurement signal 30. The units of sequence x(n) may be the s16 format previously discussed. In the embodiment discussed above, sequence x(n) is provided as the input sequence to a fast attack/slow decay filter and sequence y(n) is the sequence obtained as the output sequence of the filter. Internal to the filter, the difference between the current input sample of x(n) and the previous output sample of y(n) is computed:

$$d(n)=x(n)-y(n-1)$$

This difference is used to select the filter characteristic of the fast attack/slow decay filter. Specifically, if the difference is positive, then the fast attack filter coefficient $\beta_A$ is used, otherwise a slow decay filter coefficient $\beta_D$ is used:

$$v(n) = \begin{cases} 2^{-E_A} d(n) & \text{if } d(n) \geq 0 \\ 2^{-E_D} d(n) & \text{otherwise} \end{cases}$$

where v(n) is an internal filter variable representing a scaled difference, $E_A$ is the filter exponent for fast attack, $\beta_A = 2^{-E_A}$ is the filter coefficient for fast attack, $E_D$ is the filter exponent for slow decay, and $\beta_D = 2^{-E_D}$ is the filter coefficient for slow decay. This form for v(n) allows v(n) be computed using only an arithmetic right shift. The filter output y(n) is updated using the previous output y(n−1) adjusted by the scaled difference v(n):

$$y(n)=y(n-1)+v(n)$$

If $E_A=0$, then v(n)=d(n) without delay and y(n)=x(n) during the fast attack condition, i.e., the filter output immediately is set to the filter input if the input sample x(n) is greater than or equal to the previous filter output, y(n−1). The z-transform of the filter's impulse response during the slow decay is:

$$\frac{Y(z)}{X(x)} = \frac{\beta_D}{1-(1-\beta_D)z^{-1}}$$

which shows that the fast attack/slow decay has a first order low-pass filter characteristic.

FIG. 6 illustrates the performance of the fast attack/slow decay filter on a two-carrier waveform, in accordance with one embodiment of the present invention. In FIG. 6, the first carrier contains EVDO traffic in 25% of the slots over a period of time. The power of the carrier having EVDO traffic is also 2.5 dB stronger (when the traffic was present) than the power of the second carrier which carries CDMA traffic. Thus, the attack filter coefficient $\beta_A$ has an exponent $E_A=0$, and the decay filter coefficient $\beta_D$ has an exponent $E_D=9$. As shown in FIG. 6, when both carriers are present, the input power to the fast attack/slow decay filter input (as shown by the thin line in FIG. 6) is approximately −8.4 dBFS and when only the CDMA carrier was present, the input power of the filter is approximately −12.8 dBFS. The output signal of the fast attack/slow decay filter tracks the peaks of the filter input as shown by the thick line in FIG. 6. The standard deviation of the filter output is 0.09 dB which is significantly smaller than the bin step size of 0.75 dB. Consequently the fast attack/slow decay filter tracks the peaks of $RF_{IN}$ power signal 30 rapidly, while achieving a low variance so that bin switching occurs infrequently.

The fast attack/slow decay filter output, y(n), is compared against the power levels in column 42 of FIG. 3 to select the bin to use. One method selects the bin, indexed by k, according to the first instance that the filter output y(n) is greater than a threshold placed half-way between adjacent bins:

$$y(n) \geq \frac{R(k)+R(k+1)}{2}$$

as k varies from 0 to 5, otherwise the bin with the smallest power is selected (i.e., k=6). This method has the characteristic that, if the filter output y(n) is close to the threshold and varies from measurement to measurement (e.g., as shown in FIG. 6), controller 24 will hop frequently between two adjacent bins. As controller 24 loads coefficients 19 into multiplying DACs 20, an instant in time may exist at which some of the coefficients in the corresponding coefficient vector for one bin have been loaded, while the rest of the coefficients in multiplying DACs 20 are those coefficients in the coefficient vector for the previous bin. This partially loaded condition may cause the out-of-band distortion to temporarily increase until the full set of coefficients has been loaded. Consequently, the rate at which controller 24 hops between two adjacent bins should be reduced, when possible. This may be achieved by making the current bin, k(n), for processing epoch n+1 artificially larger than its neighbors. Hysteresis causes the current bin to be greedier than the other bins. One method for choosing the new bin, k(n+1), for the processing epoch n+1, selects that bin which minimizes the distance between the filter output and the center of the bin, but with the current bin's distance reduced by the hysteresis factor, H:

$$\min_{k(n+1)} \left\{ \frac{|y(n)-R[k(n+1)]|}{1+H\delta[k(n+1)-k(n)]} \right\}$$

where H=0.5 typically (i.e., the current bin is 50% larger than the other bins), and the delta function is given by:

$$\delta(m) = \begin{cases} 1 & \text{if } m=0 \\ 0 & \text{otherwise} \end{cases}$$

To process epoch n, controller 24 compares the currently selected bin number k(n) with the bin number from the previous processing epoch k(n−1), and if they are different, then controller 24 loads the $D_{k(n)}$ value for power detector gain signal 28 from column 43 of FIG. 3 into the power detector 15, the $S_{k(n)}$ value for $RF_{FB}$ SPM gain signal 31 from column 44 of FIG. 3 into the $RF_{FB}$ Spectrum Performance Monitor 27 from, and coefficients 19 ($w_{k(n)}$) from column 45 of FIG. 3 into the multiplying DACs 20. If bin number k(n) is the same as k(n+1), then no change is made for processing epoch n+1. RF power amplifier linearizer 1 takes a measurement, typically 40 μs in duration using the $RF_{IN}$ spectrum performance monitor 26 to produce the $RF_{IN}$ power signal 30 which in turn serves as input to the fast attack/slow decay input sample x(n). The output of the filter is y(n) for processing epoch n. y(n) is then used to select the bin number k(n+1), for the next processing epoch n+1. If bin number k(n) is the same as k(n+1) and x(n) also falls in the range of bin k(n), then the epoch n+1 qualifies for adaptation and the coefficients $w_{k(n+1)}$ are adapted. The coefficient vector for bin k is only adapted when the power level falls within the range of bin k.

In one embodiment, coefficients 19 are selected from multiple coefficient vectors, each vector corresponding to a bin centered at a selected power level. Adaptation of coefficients 19 in that embodiment uses a modified simultaneous perturbation stochastic approximation (SPSA) algorithm[2] on each coefficient vector. The modification is a quadratic curve fit to the samples of the objective function. Adaptation of a coefficient vector is carried out over several cycles, each cycle taking three qualified processing epochs, which need not be consecutive. For each cycle, a random perturbation vector p is generated that is small in amplitude relative to coefficient vector and usually has few non-zero elements. A left coefficient vector $u_k(-1)=w_k-p$ is loaded into multiplying DACs 20 for the first qualified epoch of a cycle. A center coefficient vector $u_k(0)=w_k$ is loaded for the second qualified epoch of the cycle. A right coefficient vector $u_k(+1)=w_k+p$ is loaded for the third qualified epoch of the cycle. For these processing epochs, the corresponding values b(−1), b(0) and b(+1) of out-of-band distortion signal 32 is measured. A quadratic polynomial is then fitted to these out-of-band distortion values and if the second derivative of the quadratic polynomial is positive and non-zero, then the quadratic polynomial's minimum b(t) is found, otherwise the index of the least of the three distortion powers $$\left(\text{i.e., } \min_t \{b(t)\}\right)$$

is selected.

[2] James Spall, http://www.jhuapl.edu/SPSA/ See also U.S. Pat. No. 7,026,873 "LMS-based adaptive pre-distortion for enhanced power amplifier efficiency"

The amplitude of the perturbation is constrained to be interpolation (i.e., $-1 \leq t \leq 1$) rather than extrapolation. At the end of the cycle, an updated coefficient vector for bin k is then computed using $w_k \Leftarrow w_k+tp$ to achieve a smaller out-of-band distortion than the original coefficient vector. The coefficient vector for each bin is expected to converge to a value which minimizes out-of-band distortion after adaptation over a large number of cycles (e.g., several thousand cycles). At the onset, a large amplitude may be selected for the perturbation vector, so that the minimum is rapidly acquired; thereafter, the perturbation vector's amplitude may be reduced, so that the variance in out-of-band distortion may be reduced, and the coefficient tracking time may be lengthened.

The above detailed description is provided to illustrate the specific embodiments of the present invention and is not intended to be limiting of the scope of the invention. Numerous variations and modification within the scope of the invention are possible. The present invention is set forth in the following claims.

I claim:

1. A linearizer for a power amplifier, wherein (i) the linearizer receives an input signal and provides a corrected input signal to the power amplifier, and (ii) the power amplifier provides an output signal, the linearizer comprising:
   a spectrum monitor circuit that receives both the input signal and the output signal, wherein the spectrum monitor circuit provides a plurality of power level signals, and wherein each of the power level signals represents a power level for a corresponding range of frequencies in the input and output signals;
   a power detector that receives the input signal and provides an envelope signal representative of an instantaneous power of the input signal;
   a signal generating circuit that: (i) receives the input signal, a set of coefficients and the envelop signal from the power detector, and (ii) generates therefrom the corrected input signal, wherein a portion of the corrected input signal corresponds to a polynomial function of the envelope signal; and
   a controller that (i) receives the power level signals, and (ii) provides the set of coefficients.

2. The linearizer of claim 1, wherein the controller provides the set of coefficients according to a table that maps the power levels represented by the power level signals to a plurality of coefficient sets.

3. The linearizer of claim 2, wherein the controller applies a hysteresis factor when selecting among the coefficient sets, and wherein the hysteresis factor tends to disfavor changing the set of coefficients.

4. The linearizer of claim 1, wherein each monomial in the polynomial function comprises a power of the envelope signal or a delayed power of the envelope signal.

5. The linearizer of claim 3, wherein the power levels are measured in real time.

6. The linearizer of claim 1, wherein one of the power level signals estimates an out-of-band distortion in the output signal.

7. The linearizer of claim 1, wherein the controller adapts the set of coefficients based on perturbation.

8. The linearizer of claim 7 wherein the controller responds more rapidly to an increase in the power levels than to a decrease in the power levels.

9. The linearizer of claim 1, wherein the controller generates the set of coefficients based on a fast attack/slow decay filter.

10. The linearizer of claim 1, wherein the controller receives the envelope signal and tracks peaks in the envelope signal.

11. A method for linearizing a power amplifier using a linearizer, wherein (i) the linearizer receives an input signal and provides a corrected input signal to the power amplifier, and (ii) the power amplifier provides an output signal, the method comprising:
   receiving into a spectrum monitor circuit both the input signal and the output signal to provide a plurality of power level signals, wherein each of the power level signals represents a power level for a corresponding range of frequencies in the input and output signals;
   receiving the input signal into a power detector to provide an envelope signal representative of an instantaneous power of the input signal;
   generating a polynomial function of the envelope signal based on the input signal, a set of coefficients and the envelope signal;
   including the polynomial function in the input signal to provide the corrected input signal; and
   providing the set of coefficients based on the power level signals.

12. The method of claim 11, wherein the set of coefficients are provided according to a table that maps the power levels represented by the power level signals to a plurality of coefficient sets.

13. The method of claim 11, wherein each monomial in the polynomial function comprises a power of the envelope signal or a delayed power of the envelope signal.

14. The method of claim 13, wherein the power levels are measured in real time.

15. The method of claim 11, wherein one of the power level signals estimates an out-of-band distortion in the output signal.

16. The method of claim 11, wherein the set of coefficients are adapted based on perturbation.

17. The method of claim 16, wherein the set of coefficients are adapted more rapidly to an increase in the power levels than to a decrease in the power levels.

18. The method of claim 11, wherein the set of coefficients are adapted based on a fast attack/slow decay filter.

19. The method of claim 11, further comprising tracking peaks in the envelope signal.

20. The method of claim 11, further comprising applying a hysteresis factor when selecting among the sets of coefficients, wherein the hysteresis factor tends to disfavor a change in the selected set of coefficients.

* * * * *

UNITED STATES PATENT AND TRADEMARK OFFICE
CERTIFICATE OF CORRECTION

| | |
|---|---|
| PATENT NO. | : 9,077,299 B2 |
| APPLICATION NO. | : 13/954497 |
| DATED | : July 7, 2015 |
| INVENTOR(S) | : Hawkes |

It is certified that error appears in the above-identified patent and that said Letters Patent is hereby corrected as shown below:

On the title page, in the illustrative figure, under Reference Numerals 29, 30, delete "RFIN" and insert --$RF_{In}$--; and 31, delete "RFFB" and insert --$RF_{FB}$--

In the Specification:

| | |
|---|---|
| Column 2, Line 51 | Delete "($Rf_{FB}$)" and insert --($RF_{FB}$)-- |
| Column 2, Line 65 | Delete "$d(t)=G_D\|x(t)\|^2$" and insert --$d(t)=G_D\|x(t)\|^2$,-- |
| Column 3, Line 29 | Delete "22a" and insert --22b-- |
| Column 3, Line 29 | Delete "$s_r(t)$" and insert --$s_i(t)$-- |
| Column 3, Line 30 | Delete "22b" and insert --22a-- |
| Column 3, Line 34 | Delete "22a" and insert --22b-- |
| Column 3, Line 51 | Delete "$Rf_{FB}$" and insert --$RF_{FB}$-- |

Signed and Sealed this
Twelfth Day of January, 2016

Michelle K. Lee
*Director of the United States Patent and Trademark Office*